United States Patent [19]
Russell et al.

[11] Patent Number: 5,451,378
[45] Date of Patent: * Sep. 19, 1995

[54] PHOTON CONTROLLED DECOMPOSITION OF NONHYDROLYZABLE AMBIENTS

[75] Inventors: Stephen D. Russell; Douglas A. Sexton, both of San Diego, Calif.

[73] Assignee: The United States of America as represented by the Secretary of the Navy, Washington, D.C.

[*] Notice: The portion of the term of this patent subsequent to Nov. 8, 2011 has been disclaimed.

[21] Appl. No.: 861,410

[22] Filed: Mar. 31, 1992

Related U.S. Application Data

[63] Continuation-in-part of Ser. No. 664,046, Feb. 21, 1991, Pat. No. 5,362,450.

[51] Int. Cl.⁶ .............................................. B01J 19/12
[52] U.S. Cl. .................. 412/186.3; 422/186; 422/906
[58] Field of Search ............. 422/186, 186.3, 168, 422/186, 186.3, 900, 906; 204/157.15, 157.3

[56] References Cited
PUBLICATIONS

"MPSC is it Working?" Semiconductor International, vol. 66, Oct '91.
"Toxic Gas: A Cause for Alarm" Semiconductor International Nov. '91.

*Primary Examiner*—Donald P. Walsh
*Assistant Examiner*—Daniel Jenkins
*Attorney, Agent, or Firm*—Harvey Fendelman; Thomas Glenn Keough

[57] ABSTRACT

A method and apparatus to decompose nonhydrolyzable ambients such as chlorofluorocarbons and nitrogen trifluoride which enables the conventional disposal of their byproducts are disclosed. It employs photodecomposition of the nonhydrolyzable ambient using UV light and a mediating species to allow chemical reactions to occur which form an effluent which is hydrolyzed by conventional methods. This abatement process is amenable to point-of-use decomposition systems required for modular cluster tool systems used in microelectronic device fabrication.

10 Claims, 2 Drawing Sheets

PHOTON CONTROLLED DECOMPOSITION OF NONHYDROLYZABLE AMBIENTS

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATION

This application is a continuation-in-part of patent application entitled "Laser Controlled Decomposition of Chlorofluorocarbons" by Stephen D. Russell et al., U.S. patent application Ser. No. 07/664,046 filed Feb. 21, 1991 that has issued as U.S. Pat. No. 5,362,450 and hereby incorporates by reference all documents and references thereof herein.

BACKGROUND OF THE INVENTION

The development of advanced microelectronic devices is often constrained by advances in novel fabrication techniques and the development of the associated fabrication equipment. Identification of device goals such as high speed electronics, 256 Mb and greater DRAMs and equivalent logic integrated circuits requires processing of sub-half micron features and the associated sequential processing used in cluster tool systems, as described in "MESC: Is It Working?", Semiconductor International, October 1991, pp. 66–70. This trend toward single wafer processing in modular cluster tool systems rather than batch processing of wafers is due to the need to precisely control the chemical and physical microfabrication process recipe. This imposes a major constraint on the neutralization and disposal of the toxic, corrosive and flammable gases used in device fabrication. Conventional rooftop scrubbers attached to a cluster tool system can effect back pressure and gas flow between modules, ultimately prohibiting control of the separate fabrication process recipes. In addition, such gas abatement schemes may allow mixing of incompatible gases or reaction by-products. Point-of-use scrubbing of process gases is required to decouple the effects of gas abatement on the fabrication process itself, and prevent incompatible mixing of gases.

One group of gases that is commonly used in microelectronic fabrication systems are the chlorofluorocarbons. Recent studies have, however, emphasized the current concern over the use of chlorofluorocarbons (CFCs) and their effect on our environment, please refer to "Summary of the U.S. National Academy of Sciences Report: Stratospheric Ozone Depletion by Halocarbons: Chemistry and Transport", by H. I. Schiff in A. C. Aikin, editor, *Proceedings of the NATO Advanced Study Institute on Atmospheric Ozone: Its Variation and Human Influences*, FAA-EE-80-20, May 1980, pp. 967–975; "The Changing Atmosphere", by T. E. Graedel et al. in *Scientific American*, vol. 261, 1989, pp. 58–68; "The Antarctic Ozone Hole", by R. S. Stolarski, in *Scientific American*, vol. 258, 1988, pp. 30–36; "Nimbus 7 Satellite Measurements of the Springtime Antarctic Ozone Decrease", by R. S. Stolarski et al. in Nature, vol. 322, 1986, pp. 808–811; "Large Losses of Total Ozone in Antarctica Reveal Seasonal $ClO_x/NO_x$ Interaction", by J. C. Farman et al. in *Nature*, vol. 315, 1985, pp. 207–210; "Charting the Ozone Alert", by R. N. Dubinsky, in *Lasers and Optronics*, vol. 8, 1989, pp. 45–54; "Stratospheric Sink for Chlorofluoromethanes: Chlorine AtomC-atalyzed [sic] Destruction of Ozone" by M. J. Molina et al, in *Nature*, vol. 249, 1974, pp. 810–812; "Global Trends in Total Ozone", by K. P. Bowman, in *Science*, vol. 239, 1988, pp. 48–50; and "Science of the Ozone Layer", by W. F. J. Evans, in *Chinook*, vol. 10, 1988, pp. 28–33.

In particular, the destruction of the earth's ozone layer has been attributed to the release of the chlorofluorocarbon gases into the atmosphere where they subsequently react with the ozone. Any decrease in stratospheric ozone may have serious effects since it influences weather patterns and shields the earth's surface from solar ultraviolet (UV) radiation. The latter could elevate the incidence of skin cancer and cataracts in humans, and may damage crops and phytoplankton (the basis of the oceanic food chain). In addition, rising levels of CFCs, together with methane ($CH_4$) nitrous oxide ($N_2O$) and carbon dioxide ($CO_2$) are enhancing the greenhouse effect, see above referenced article by Stolarski.

Furthermore, disruptions in weather patterns at the earth's poles, whose cold temperatures enhance the ozone depletion reactions, may have strategic implications for these regions. To date, the extent of ozone depletion has been most dramatic over Antarctica, where an ozone hole has appeared each southern spring since 1975, see the above referenced articles by T. E. Graedel et al., R. S. Stolarski, R. S. Stolarski et al., J. C. Farman et al., and "Excimer and Dye Lasers Sensing the Atmosphere", in *Lambda Highlights*, edited by U. Brinkmann, Gottingen, FRG, published by Lambda Physik GmbH, August 1988, pp. 1–3. In the past decade springtime ozone levels have diminished by about 50% over Antarctica. Preliminary global studies have shown depletions of from 2 to 10% have begun to occur during the winter and early spring in the middle to high latitudes of the northern hemisphere, see above referenced article by T. E. Graedel et al. For these reasons, there has been international cooperation to control the use of CFCs as exemplified by the 1987 Montreal Protocol, see above referenced article by R. N. Dubinsky. Potential regulations over the use and release of these gases may adversely affect many industries if the use and disposal of CFCs is not an environmentally sound technology.

CFCs are compounds containing chlorine (Cl), fluorine (F), carbon (C) and sometimes hydrogen (H). They are normally nontoxic, inert and cheap to manufacture. Their uses range from refrigerator coolants, cleaning solutions, propellants, plasma etchants in the microelectronics industry, and standard ingredients in plastic foams. The characteristics that make the CFCs inert allows them to remain in the free state for more than 100 years after being released into the troposphere, see above reference article by M. J. Molina et al. and "Release of Industrial Halocarbons and Tropospheric Budget", in above referenced book by A. C. Aikin, editor, pp. 373–396. The CFCs slowly percolate into the stratosphere where the ozone layer resides from 15 to 50 kilometers above the earth's surface. Here, absorption of solar UV photons and subsequent dissociation results in destruction of the ozone catalytically by substances such as Cl and $ClO_x$. Stratospheric ozone ($O_3$) is formed when an oxygen molecule ($O_2$) is dissociated by solar UV radiation, the free oxygen atoms can then combine with another oxygen molecule to form ozone:

$$O_2 + h\nu \rightarrow O + O \quad (1)$$

$$O + O_2 \rightarrow O_3. \quad (2)$$

Usually, photochemical reactions catalyzed by nitrous oxides ($NO_x$) remove ozone at a rate equal to the rate of its formation. Chlorine catalytic cycles can disturb this natural balance. The role of CFCs is that of a source of atomic chlorine which begins a cycle of chemical reactions, destroying ozone. An example of a common CFC released into the troposphere is dichlorodifluoromethane ($CF_2Cl_2$). Stratospheric photolytic dissociation by solar radiation creates two odd-electron species, one chlorine atom and one free radical:

$$CF_2Cl_2 + h\nu \rightarrow CF_2Cl. \quad (3)$$

The cycle begins with the breakup of ozone by atomic chlorine and the formation of chlorine monoxide (ClO) and molecular oxygen ($O_2$):

$$Cl + O_3 \rightarrow ClO + O_2. \quad (4)$$

Then the chlorine monoxide reacts with an oxygen atom formed by the photodissociation of another oxygen molecule (reaction equation [1] above) and liberates the chlorine which can initiate the cycle again:

$$ClO + O \rightarrow Cl + O_2. \quad (5)$$

Under most conditions of the earth's ozone layer, reaction equation (5) above is a slower reaction than (4) because there is much lower concentration of oxygen atoms (O) than ozone ($O_3$).

Chlorine monoxide reactions with nitrogen oxides are a competing reaction that can remove chlorine from this cycle by combining to form chlorine nitrate ($ClNO_3$), see above referenced article by M. J. Molina et al. and "Free Radicals in the Earth's Stratosphere: A Review of Recent Results", by J. G. Anderson, in above referenced book edited by A. C. Aikin, pp. 233–251. However, at stratospheric temperatures ClO reacts with O six times faster than $NO_2$ reacts with O. Consequently, the Cl-ClO chain can be considerably more efficient than the $NO-NO_2$ chain in catalytic conversion of $O_3 + O \rightarrow 2O_2$ per unit time, see above referenced article by M. J. Molina et al. It is generally agreed that after studies of the relative reaction rates described above, $ClO_x$ and Cl molecules from CFCs are the cause of stratospheric ozone depletion.

Users of large volumes of chlorofluorocarbons must currently release CFCs into the atmosphere because they cannot be decomposed and removed from the "waste" gases used in their particular process. Conventional scrubbers, filters, and CDOs (Controlled Decomposition and Oxidation Chambers or "burn boxes") are used to remove most toxic, corrosive and flammable gases used in industrial applications but do not affect chlorofluorocarbons because they are inert.

Recent advances in dry etching of silicon and silicon-on-sapphire also use gases such as nitrogen trifluoide and other halocarbons which cannot be hydrolyzed (scrubbed) by conventional techniques, and therefore pose a threat to personnel and the environment if not abated, see "Toxic Gas: A Cause for Alarm" Semiconductor International, November 1991, pp. 68–72. Since cluster tool fabrication systems employ both deposition and etching reactions required for microelectronic device fabrication, abatement schemes compatible with processing other gases such as silane, germane, and dichlorosilane which are normally decomposed using CDOs are desirable.

Thus, a continuing need exists in the state of the art for a gas abatement system which is amenable to point-of-use decomposition to avoid the above cluster tool system problems and which can treat nonhydrolyzable ambients as required for advanced silicon and silicon-on-sapphire microelectronic device processing. A photon controlled technique herein is described to induce decomposition of nonhydrolyzable ambients whereby the gaseous or liquid—are broken down and the by-products are subsequently hydrolyzed and disposed of by conventional means, and is amenable for point-of-use process gas abatement.

Summary of the Invention

The present invention is directed to providing a method for decomposing nonhydrolyzable ambients (gases or liquids) enabling a conventional disposal of their by-products. The method includes placing the nonhydrolyzable ambient in a reaction chamber and including a Group IV chemical element-based mediating species (for example, silicon) in the reaction chamber prior to launching UV light into the reaction chamber. This causes a photo-decomposing or photodissociating of the nonhydrolyzable ambient (e.g. nitrogen trifluoride or CFCs) into halocarbon, halogen and other radicals so that a reacting with the silicon (Si) or other Group IV chemical element-based mediating species in the reaction chamber can occur to form scrubable or hydrolyzable by-products. The apparatus includes a reaction chamber, a mediating species in the reaction chamber and a means for feeding the nonhydrolyzable ambient into the reaction chamber. An ultraviolet (UV) light source radiates into the reaction chamber so that photo-decomposing or photodissociating the nonhydrolyzable ambient into radicals can occur. The radicals react with the Si or other Group IV chemical element-based mediating species and these reaction by-products are evacuated from the reaction chamber and subsequently scrubbed and hydrolyzed, to create disposable by-products.

An object of the invention is to provide a practical, environmentally safe way to release nonhydrolyzable ambients into the atmosphere.

Another object is to provide a method for releasing nonhydrolyzable ambients employing a UV light source and Si-based mediating species to ensure increased effectiveness of the process.

Another object is to provide a method for releasing nonhydrolyzable ambients employing UV light source and group IV chemical element-based mediating species to ensure increasing effectiveness of the process.

Another object is to provide a method for decomposing nonhydrolyzable ambients having a greater efficiency with reduced associated complications.

Another object is to provide a method for decomposing nonhydrolyzable ambients relying on UV photon dissociation for the decomposition and disposal of the nonhydrolyzable ambients.

Another object is to provide a method for releasing nonhydrolyzable ambients amenable with point-of-use gas—or disposal systems.

These and other objects of the invention will become more readily apparent to one skilled in the art to which this invention pertains in view of the ensuing specifications when taken in conjunction with the claims and drawings.

DESCRIPTION OF THE PREFERRED EMBODIMENTS

Figure 1:
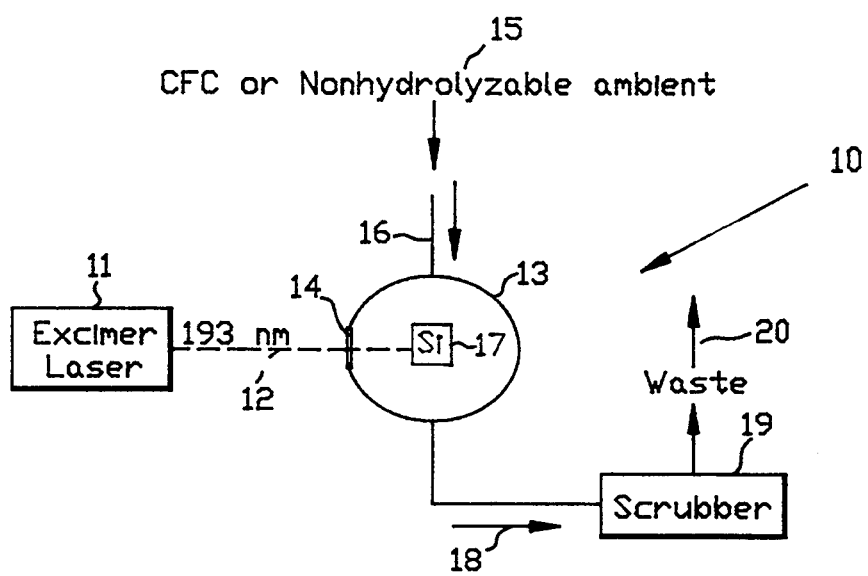
FIG. 1 depicts one embodiment of the photon controlled decomposition system using an excimer laser to control the decomposition process.
Figure 3:
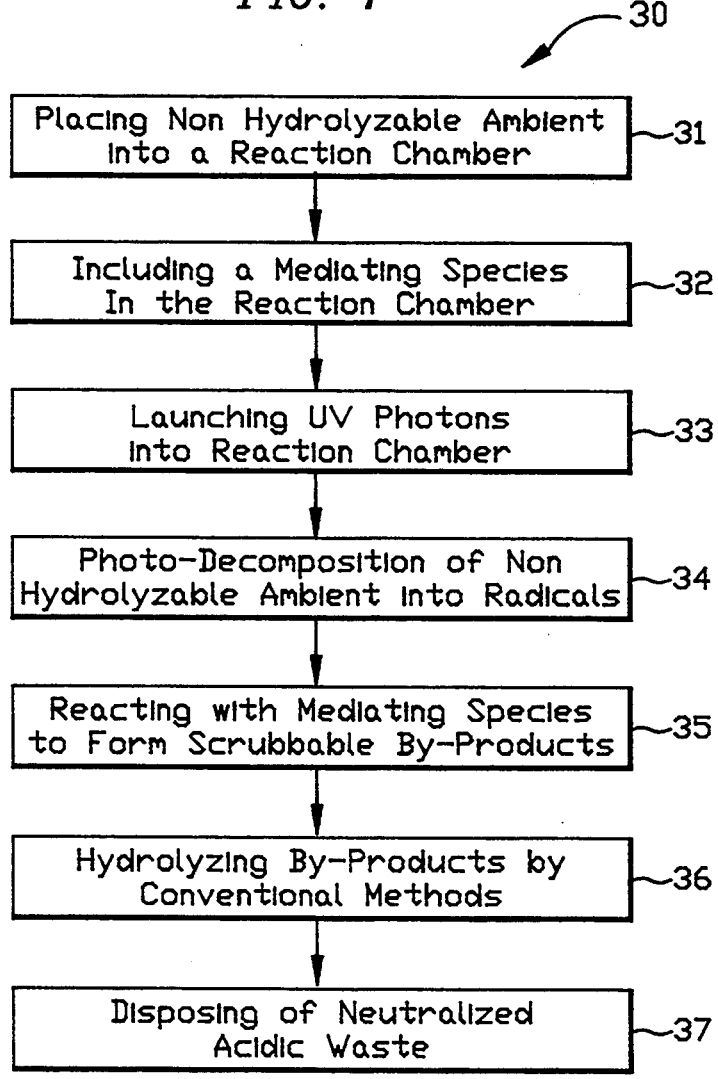
FIG. 3 shows a schematic of the photon controlled decomposition process.

FIG. 1 shows a schematic of one embodiment of the photon controlled decomposition system 10 for the photon controlled decomposition process 30 depicted in FIG. 3. An excimer laser 11 operating with an ArF gain medium (at 193 nm) launches UV light 12 into a laser controlled decomposition reaction chamber 13 through a window assembly 14. Chlorofluorocarbon (CFC) gases or nonhydrolyzable ambients 15 are inserted into the reaction chamber via a CFC inlet 16 using conventional techniques and are maintained at a sufficiently high pressure to ensure efficient decomposition by incident UV light 12.

The reaction chamber is designed according to standard practices to handle toxic/corrosive gases or liquids obtained during the processing, and may be engineered for optimal photodecomposition by utilizing multi-pass resonators or multiple reflections to increase the path length of the UV photons of UV light within the CFC ambient. In this embodiment, a Si-based mediating species 17, for example a solid silicon medium, in the reaction chamber reacts with the photodissociated radicals. UV light 12 from laser 11 is aligned to be incident on the Si-based mediating species to increase the reactivity photothermally. An effluent gas/liquid 18 is sent to a convention al scrubber 19 to hydrolyze and neutralize the by-products and thereby create a neutralized waste 20.

The use of an excimer laser is not a requirement to achieve photodecomposition of the chlorofluorocarbon gas; however, the high fluence of photons attainable with such a device will increase the effectiveness of the process. Excimer lasers have excellent "wall-plug" efficiency; however, their size and complexity may tend to limit their use in, for example, point-of-use applications. Similarly, there is no restriction to 193 nm light, but photons of sufficient energy are provided at 193 nm to cleave the halogen bonds; therefore, smaller continuous wave light sources such as mercury-xenon arc lamps may be appropriate for small-scale mobile processing or point-of-use abatement systems for cluster tool processing.

FIG. 3 schematically shows the process 30 of photon controlled decomposition of nonhydrolyzable ambients. Hereinafter we refer to CFCs, nitrogen trifluoride or other nonhydrolyzable ambients so that extension of this method to other nonhydrolyzable ambients such as nitrogen trifluoride will be evident to those skilled in the art from these teachings. The photon controlled decomposition process calls for the placing 31 of chlorofluorocarbon gas or a nonhydrolyzable ambient 15 within the reaction chamber 13 that has an including 32 of a Si-based mediating species therein. Launching 33 of ultraviolet (UV) photons of UV light 12 from excimer laser 11 or another high fluence source into reaction chamber 13 in an either pulsed or continuous wave (CW) mode enables the photodissociation (or photodecomposition) 34 of the chlorofluorocarbon into halocarbon and halogen radicals or the nonhydrolyzable ambient into other radicals.

The halocarbon and halogen radicals enable a spontaneous reacting 35 with a "mediating species", in this example a silicon based mediating species 17. The mediating species may be in a solid, liquid or gaseous form containing silicon (or other Group IV chemical element-based compound), whose reaction with these by-products provides an effluent which is easily hydrolyzed by a conventional scrubber 19 so that a hydrolyzing 36 by the conventional scrubbers can occur. The mediating species allows a halocarbon scavaging reaction (or chain reaction) to occur whose products can be treated and allow the disposing 37 thereof. Details of this process are described below.

Figure 2:
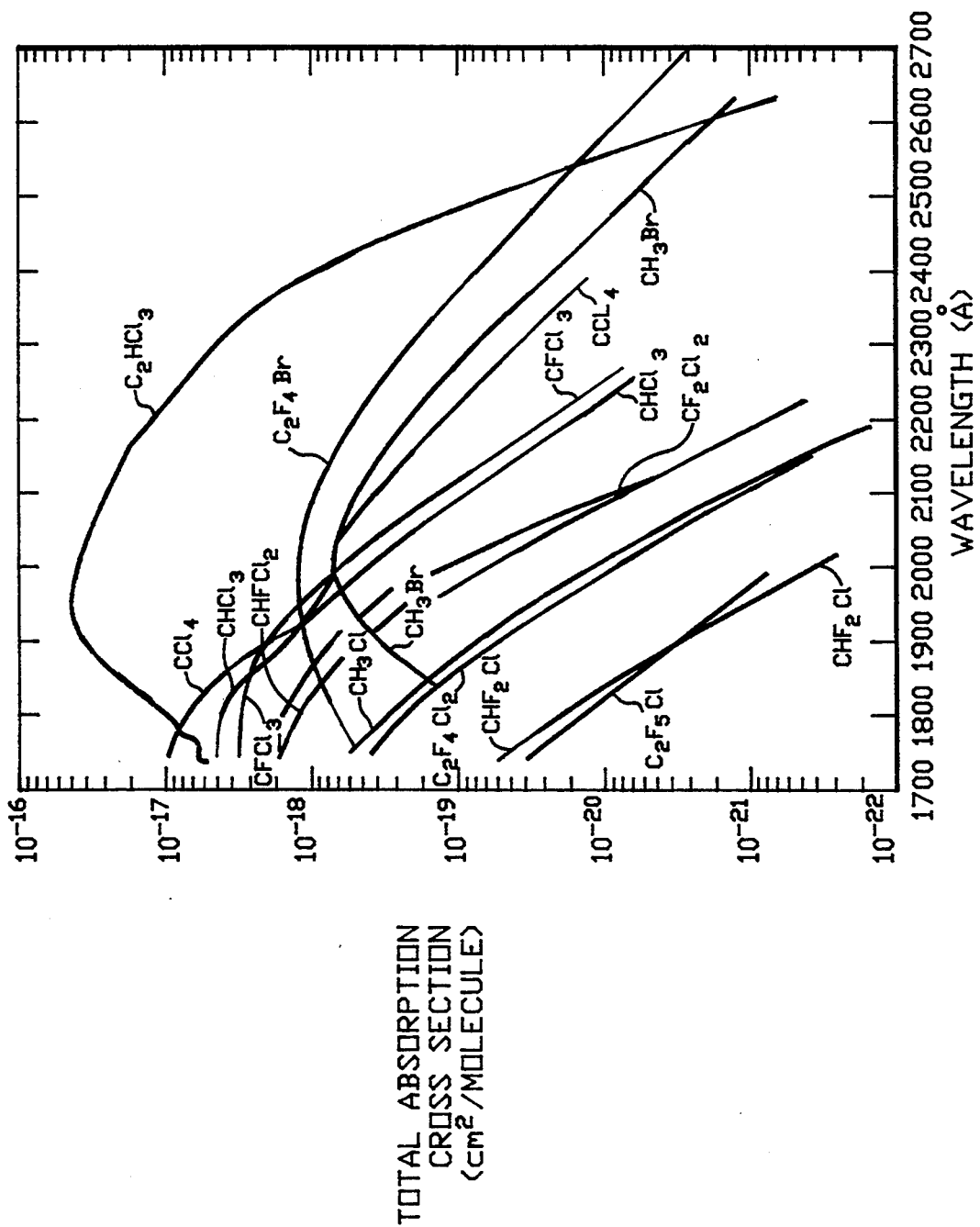
FIG. 2 depicts the absorption cross-section for common CFCs.

This process relies on the absorption properties of chlorofluorocarbons or nonhydrolyzable ambients 15, and in some embodiments also the mediating species 17, in the UV region of the electromagnetic spectrum. FIG. 2 shows the absorption cross-section versus wavelength for a number of common chlorofluorocarbons, see "UV Photoabsorption Cross Sections for Halocarbons", by D. E. Robbins, in NASA-CR-154106, *Int. Conf. Probl. Relat. Stratos.*, 1976, pp. 255–257. There is strong absorption, particularly at wavelengths below 200 nm due to the C-X bonds (X=Cl,F). Typical bond energies of −485 kJ/mole (5 eV) for the C-X bonds, are easily cleaved by the 6.4 eV laser photons of an excimer laser operating at 193 nm (using an ArF gain medium). The halocarbon radicals produced by photolysis react with a silicon-based mediating species forming by-products which can be conventionally disposed. The process may be amplified by chain reactions.

Photothermal dissociation of the CFC chloropentafluoroethane ($C_2ClF_5$) by an excimer laser has shown that the resulting by-products will react with elementary silicon, see "Excimer Laser-Assisted Etching of Silicon Using Chloropentafluoroethane", by S. D. Russell and D. A. Sexton, in R. Rosenberg et al., eds., *In-Situ Patterning: Selective Area Deposition and Etching*, Mat. Res. Soc. Proc., vol. 158, pp. 325–330. An example of the LCD process used to induce decomposition of $C_2ClF_5$ is given by:

(I) photolysis of the CFC according to the reaction

$$C_2ClF_5 + h\nu \rightarrow C_2ClF_4 + F, \tag{6}$$

(II) halogen reactions with a silicon mediating species produce

$$Si + 4F \rightarrow SiF_4 \tag{7}$$

$$Si + 4Cl \rightarrow SiCl_4, \tag{8}$$

(III) and, photolysis of these by-products yields, for example:

$$SiCl_4 + h\nu \rightarrow SiCl_3 + Cl, \tag{9}$$

(IV) finally, reaction of the carbon centers with intermediate silicon species occurs. The reaction may go to completion by:

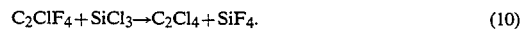
$$C_2ClF_4 + SiCl_3 \rightarrow C_2Cl_4 + SiF_4. \tag{10}$$

The resulting product $C_2ClF_4$ is a colorless liquid (tetrachloroethylene) which is soluble in alcohol and ether, see *CRC Handbook of Chemistry and Physics*, edited by R. D. Weast, 67th ed., published in Boca Raton, Fla. by CRC Press, 1986, pp. B-82 and B-126-127. The other produce, silicon tetrafluoride, can be hydrolyzed as described below. Depending on the CFC to be processed and competing reactions, the LCD process will produce forms of silane/silicon carbides which can be conventionally decomposed through hydrolysis or by burning, see above referenced book edited by R. D. Weast.

Silicon tetrafluoride is a colorless gas which forms a dense white mist in moist air and hydrolyses according to the overall equation, see R. D. Weast, referenced above:

$$3SiF_4 + 2H_2O \rightarrow SiO_2 + 2H_2SiF_6. \tag{11}$$

Silicon tetrafluoride is also readily prepared by direct halogenation of silicon and its alloys with elemental fluorine at room temperature through the reaction, see *Halogen Chemistry* edited by V. Gutmann, Vol. 2, published in New York by Academic Press, 1967, pp. 173-180:

$$Si + 2F_2 \rightarrow SiF_4 + 360 \text{ kcal/mole}. \tag{12}$$

The fluorination can also be carried out on $SiO_2$ in the absence of reducing agents because the bond energy Si-F ($\sim 90$ kcal) is greater than that of Si-O ($\sim 70$ kcal).

Reaction between the silicon within the chamber and a chlorine radical also takes place spontaneously, resulting in the tetrahalide silicon tetrachloride ($SiCl_4$). The commercial use of silicon tetrachloride is for the production of silane by reducing with lithium, magnesium, sodium or calcium aluminum hydride in ethyl ether, see *Matheson Gas Data Book* by W. Braker and A. L. Mossman, published in Secaucus, N.J. by Matheson Gas Products, 1980, p. 633. Therefore, there is a large body of knowledge on the production of this gas. Silicon tetrachloride is almost exclusively made by chlorination with elementary chlorine of elementary silicon, silicon alloys and silicon compounds. Silicon tetrachloride is a colorless volatile liquid at ambient temperature, with a boiling point of 57.6° C. The liquid is a very reactive substance, whose best known reaction is hydrolysis with the evolution of hydrochloric acid (HCl) and simultaneous formation of a fine mist of silica which deposits as a white coating. This rapid and highly exothermic (70 kcal/mole) process takes place via the equation, see above referenced book edited by V. Gutmann:

$$SiCl_4 + 4H_2O \rightarrow Si(OH)_4 + 4HCl. \tag{13}$$

In the gas phase, silicon tetrachloride does not react with water vapor unless HCl acceptors such as trimethylamine are present, see R. S. Stolarsky et al. referenced above.

The above teachings describe how the by-products of the photon controlled decomposition of nonhydrolyzable ambients process can be hydrolyzed and conventionally decomposed; therefore, scrubbing schemes can effectively remove these from the effluent with subsequent standard neutralization and disposal of the waste acid. This also allows the concatenation of conventional point-of-use scrubbing systems with the photon controlled decomposition process resulting in a complete nonhydrolyzable ambient abatement system.

As disclosed in the preceding paragraphs, the mediating species is not required to be in solid form. Gaseous silicon tetrafluoride and silicon tetrachloride and a variety of silanes are also subject to photodissociation in the UV; therefore, they can provide the source for the silicon-halogen reaction. Furthermore, the gaseous mediating species may aid the chain reactions necessary for efficient removal of the halocarbon radicals produced in the CFC photolysis.

Modifications to the design of the chamber can be envisioned to optimize the pre-hydrolysis reactions depending on the composition of the reaction medium and the state (solid, liquid or gaseous) of the effluent desired for subsequent processing. For example, temperature variation of the reaction medium and/or the chamber may be used to enhance or select a particular chemical reaction. Variations in the chamber embodiment were also described in previous paragraphs.

In addition, depending on the rate of the photodissociation of the halogen by the UV light source, it may be desirable to contain the gas within the chamber for some determined time period or reflow the gas for additional processing for complete decomposition. In some applications, ambients not entirely scrubbed of CFCs by the photon controlled procedure may be recirculated back into the original process for reuse while liquid effluent is treated. Therefore, variations in design can be envisioned to optimize various portions of this decomposition scheme for efficient processing.

This processing scheme, although designed specifically for CFCs, may also be applied to any halogen containing nonhydrolyzable ambient. For example, nitrogen trifluoride is readily photodociated by UV light, and the fluorine radicals readily react with silicon forming the hydrolyzable by-products described above. Nitrogen trifluoride has significantly lower bond strengths than common CFCs, 272 kJ/mol and 485 kJ/mol, respectively. This allows both photolytic and pyrolytic decomposition by light. Illumination of silicon with laser fluences above the melt threshold, roughly 0.7 J/cm$^2$ at 248 nm, in the presence of a nitrogen trifluoride ambient at 500 torr results in an etch rate of about 0.25 angstrom per pulse, while no reaction was observed at lower fluences. This etching reaction demonstrates the ability to decompose the ambient and react it with the silicon mediating species to form hydrolyzable silicon tetrafluoride ($SiF_4$). In addition, any Group IV chemical elements (and compounds containing them) may serve as acceptable substitutions to silicon for the decomposition reactions.

Obviously, many other modifications and variation of the present invention are possible in the light of the above teachings. It is therefore to be understood that within the scope of the inventive concept the invention may be practiced otherwise than as specifically claimed.

We claim:

1. An apparatus for decomposing a nonhydrolyzable ambient comprising:
   a reaction chamber;
   means for feeding said nonhydrolyzable ambient into said reaction chamber;
   means for radiating UV light into said reaction chamber;
   means disposed in said reaction chamber for photo-decomposing or photo-dissociating said nonhydrolyzable ambient into radicals;
   the photo-decomposing or photodissociating means includes a silicon-based mediating species in said reaction chamber to form scrubable by-products from said nonhydrolyzable ambient;

means for evacuating said scrubable by-products from said reaction chamber; and means coupled to receive said scrubable by-products from the evacuating means for scrubbing to create disposable waste.

2. A apparatus according to claim 1 in which said silicon-based mediating species is silicon in a solid state.

3. A apparatus according to claim 1 in which said mediating species is silicon in a gaseous state.

4. A apparatus according to claim 1 in which said mediating species is silicon in a liquid state.

5. A apparatus according to claim 2, 3 or 4 in which the UV light radiating means is an excimer laser.

6. A apparatus according to claim 5 in which the means for scrubbing includes a means for hydrolyzing said by-products.

7. An apparatus for decomposing a nonhydrolyzable ambient comprising:

a reaction chamber;

means for feeding said nonhydrolyzable ambient into said reaction chamber;

means for radiating UV light into said reaction chamber;

means disposed in said reaction chamber for photo-decomposing or photodissociating said nonhydrolyzable ambient into radicals;

the photo-decomposing or photodissociating means includes a Group IV chemical element-based mediating species in said reaction chamber to form scrubable by-products from said nonhydrolyzable ambient;

means for evacuating said scrubable by-products from said reaction chamber; and means coupled to receive said scrubable by-products from the evacuating means for scrubbing to create disposable waste.

8. An apparatus according to claim 7 in which said Group IV chemical element-based mediating species is in a solid state.

9. An apparatus according to claim 7 in which said Group IV chemical element-based mediating species is in a liquid state.

10. An apparatus according to claim 7 in which said Group IV chemical element-based mediating species is in a gaseous state.

* * * * *